(12) United States Patent
Lin et al.

(10) Patent No.: US 6,297,112 B1
(45) Date of Patent: Oct. 2, 2001

(54) METHOD OF FORMING A MOS TRANSISTOR

(75) Inventors: Tony Lin, Kao-Hsiung Hsien; Tung-Po Chen, Tai-Chung; Ming-Yin Hao, Taipei, all of (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/497,668

(22) Filed: Feb. 4, 2000

(51) Int. Cl.[7] ................................................. H01L 21/336
(52) U.S. Cl. ..................... 438/303; 438/306; 438/307; 438/976
(58) Field of Search ................................. 438/303, 306, 438/307, 906, 976, 313; 430/327; 134/1.3; 510/175

(56) References Cited

U.S. PATENT DOCUMENTS

| | | | |
|---|---|---|---|
| 5,234,850 | * 8/1993 | Liao | 438/231 |
| 6,194,279 | * 2/2001 | Chen et al. | 438/303 |
| 6,200,840 | * 3/2001 | Chen et al. | 438/184 |
| 6,207,520 | * 3/2001 | Gardner et al. | 438/308 |

OTHER PUBLICATIONS

Wolf et al., Silicon Processing for the VLSI Era vol. 1: Process Technology, (Lattice Press, 1986), pp. 514–520.*

* cited by examiner

Primary Examiner—Amir Zarabian
Assistant Examiner—Christian D. Wilson
(74) Attorney, Agent, or Firm—Winston Hsu

(57) ABSTRACT

The present invention provides a method of forming a PMOS transistor or an NMOS transistor on a semiconductor wafer. The semiconductor wafer comprises a silicon substrate and a gate positioned on a predetermined area of the silicon substrate. First, a protection layer of uniform thickness made of silicon nitride is formed on the semiconductor wafer to cover the surface of the gate. Then, a first ion implantation process is performed to form a first ion implantation layer with a first predetermined thickness on the silicon substrate around the gate. Then, an RCA cleaning process is performed to remove impurities on the semiconductor wafer. Next, a spacer is formed around the gate. Finally, a second ion implantation process is performed to form a second ion implantation layer with a second predetermined thickness on the silicon substrate around the gate. The second ion implantation layer is used as a source or drain (S/D) of the MOS transistor. The portion of the first ion implantation layer that is not covered by the second ion implantation layer is used as a lightly doped drain (LDD). The protection layer is used to protect the surface of the silicon substrate from being etched during the RCA cleaning process so as to prevent an increase of the electrical resistance of the LDD.

5 Claims, 5 Drawing Sheets

METHOD OF FORMING A MOS TRANSISTOR

BACKGROUND OF THE INVENTION

1. Field of the Invention

The present invention relates to a method of forming a MOS transistor, and more particularly, to a method of forming a MOS transistor to prevent damage caused by an RCA cleaning process.

2. Description of the Prior Art

Metal oxide semiconductor (MOS) transistors are probably the most important components of semiconductor products. They are generally categorized as P-channel MOS (PMOS) transistors, N-channel MOS (NMOS) transistors or complementary MOS (CMOS) transistors. A MOS transistor comprises a gate, a drain and a source. In general, the gate is first formed on a silicon substrate of a semiconductor wafer. Then, an ion implantation process is performed, using the gate as a mask, to form a lightly doped drain (LDD), or a source and drain (S/D) on the silicon substrate around the gate. Then, a cleaning process is performed to remove impurities or contaminants on the semiconductor wafer so as to ensure the material properties of subsequent processes.

Hundreds of thousands of PMOS transistors and NMOS transistors can be formed on the semiconductor wafer at the same time. In order to define which of the PMOS transistors and the NMOS transistors are to undergo an ion implantation process, a photoresist layer must be formed prior to the ion implantation process to cover a predetermined area of the semiconductor wafer. Each time an ion implantation process is completed, the photoresist layer must be removed and an RCA cleaning process must be performed to rinse the surface of the semiconductor wafer.

However, the RCA cleaning process uses specific proportions of $H_2O_2$, $H_2O$, $NH_4OH$, or $HCl$, which readily react with silicon or silicon oxide. Consequently, after the RCA cleaning process, a portion of the silicon substrate, or a silicon oxide layer on the semiconductor wafer, is etched. This disrupts the planarity of the semiconductor wafer. It also changes the thickness of the LDD on the silicon substrate, which effects the performance of the MOS transistor. Therefore, improving the method of forming the MOS transistor to prevent the damage caused by the RCA cleaning process becomes an important issue.

Please refer to FIG. 1 and FIG. 2. FIG. 1 and FIG. 2 are cross-sectional schematic diagrams of a method of forming a MOS transistor 20 according to the prior art. The MOS transistor 20 of the prior art is formed on a semiconductor wafer 10 that comprises a silicon substrate 12, a gate oxide layer 14 positioned on the silicon substrate 12, and at least one gate 16 positioned on a predetermined area of the silicon substrate 12. First, a photoresist layer (not shown) is formed on the semiconductor wafer 10 to define an active region. Then, an ion implantation process is performed, using both the photoresist layer and the gate 16 as a mask, to form a doped layer 18 on the silicon substrate 12 around the gate 16. The doped layer 18 is used as an LDD or an S/D of the MOS transistor 20. Then, after the photoresist layer is removed, an RCA cleaning process is performed to remove impurities or contaminants on the semiconductor wafer 10.

Since the cleaning solution used in the RCA cleaning process reacts with silicon, a portion of the silicon substrate 12 around the gate 16 is etched, forming an uneven surface after the RCA cleaning process, as shown in FIG. 2. This decreases the size of the doped layer 18 and increases the series resistance from the drain to the source, which leads to slower operating speeds of the MOS transistor 20.

In order to solve the above-mentioned problem, another prior art method of forming a MOS transistor uses a silicon oxide layer to protect the surface of the semiconductor wafer 10 so as to protect the silicon substrate 12 around the gate 16 from being etched. Please refer to FIG. 3 and FIG. 4. FIG. 3 and FIG. 4 are cross-sectional schematic diagrams of another method of forming a MOS transistor 24 according to the prior art. First, a silicon oxide layer 22 is formed on the semiconductor wafer 10 to cover the surface of the gate 16 and the gate oxide layer 14. Then, a photoresist layer (not shown) is formed on the semiconductor wafer 10 to define an active region. An ion implantation process is the performed, using the photoresist layer and the gate 16 as a mask, to form a doped layer 18 on the silicon substrate 12 around the gate 16. The doped layer 18 is used as an LDD or S/D of the MOS transistor 24. Next, after the photoresist layer is removed, an RCA cleaning process is performed to remove impurities and contaminants on the semiconductor wafer 10.

During the RCA cleaning process, a portion of the silicon oxide layer 22 is etched to form an uneven surface after the RCA cleaning process, as shown in FIG. 4. The silicon oxide layer 22 remaining on the semiconductor wafer 10 protects the surface of the silicon substrate 12 around the gate 16 from being etched. This prevents the decrease in size of the doped layer 18. However, during the ion implantation process, oxygen ions from the silicon oxide layer 22 diffuse into the doped layer 18, resulting in oxide enhanced diffusion (OED). This changes the doping concentration of the doped layer 18 and effects the performance of the MOS transistor 24. Furthermore, if boron ions are the primary dopants used in the ion implantation process, the boron ions in the doped layer 18 will diffuse into the silicon oxide layer 22 and thus decrease the concentration of boron ions in the doped layer 18.

SUMMARY OF THE INVENTION

It is therefore a primary objective of the present invention to provide a method of forming a MOS transistor to prevent damage caused by RCA cleaning processes and ensure the performance of the MOS transistor.

In a preferred embodiment, the present invention provides a method of forming a PMOS transistor or an NMOS transistor on a semiconductor wafer. The semiconductor wafer comprises a silicon substrate and a gate positioned on a predetermined area of the silicon substrate. First, a protection layer of uniform thickness made of silicon nitride is formed on the semiconductor wafer to cover the surface of the gate. Then, a first ion implantation process is performed to form a first ion implantation layer with a first predetermined thickness on the silicon substrate around the gate. Then, an RCA cleaning process is performed to remove impurities on the semiconductor wafer. Next, a spacer is formed around the gate. Finally, a second ion implantation process is performed to form a second ion implantation layer with a second predetermined thickness on the silicon substrate around the gate. The second ion implantation layer is used as a source or drain (S/D) of the MOS transistor. A portion of the first ion implantation layer that is not covered by the second ion implantation layer is used as a lightly doped drain (LDD). The protection layer is used to protect the surface of the silicon substrate from being etched during the RCA cleaning process so as to prevent an increase of electrical resistance in the LDD.

It is an advantage of the present invention that the protection layer made of silicon nitride is first formed on the semiconductor wafer to prevent the surface of the silicon substrate around the gate from being etched during the RCA cleaning process. Also, this protects the first ion implantation layer from oxygen ions during the first ion implantation process so as to prevent a decrease of the doping concentration of the first ion implantation layer.

These and other objectives of the present invention will no doubt become obvious to those of ordinary skill in the art after having read the following detailed description of the preferred embodiment, which is illustrated in the various figures and drawings.

DETAILED DESCRIPTION OF THE PREFERRED EMBODIMENT

Figure 1:
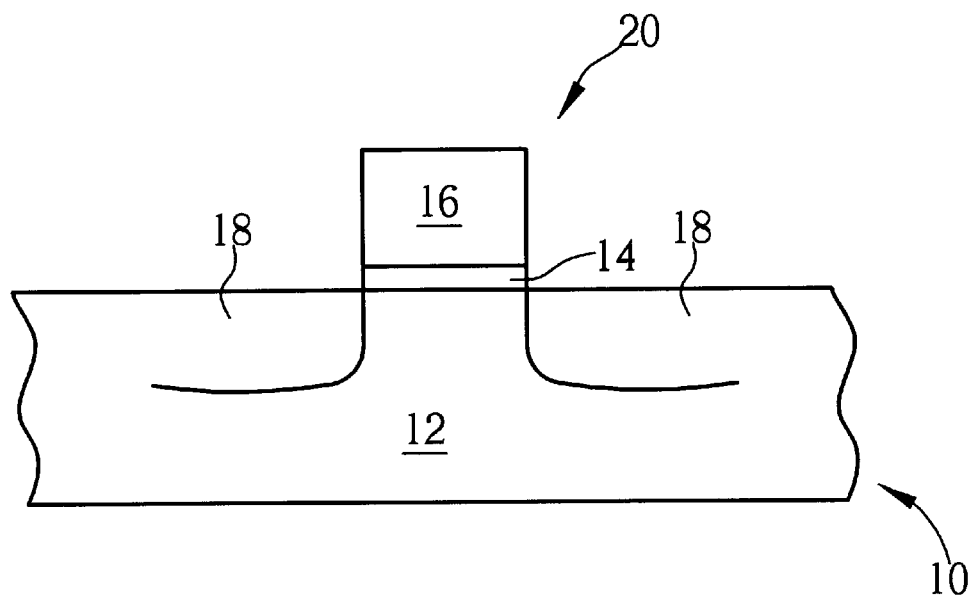
FIG. 1 and FIG. 2 are cross-sectional schematic diagrams of a method of forming a MOS transistor according to the prior art.
Figure 2:
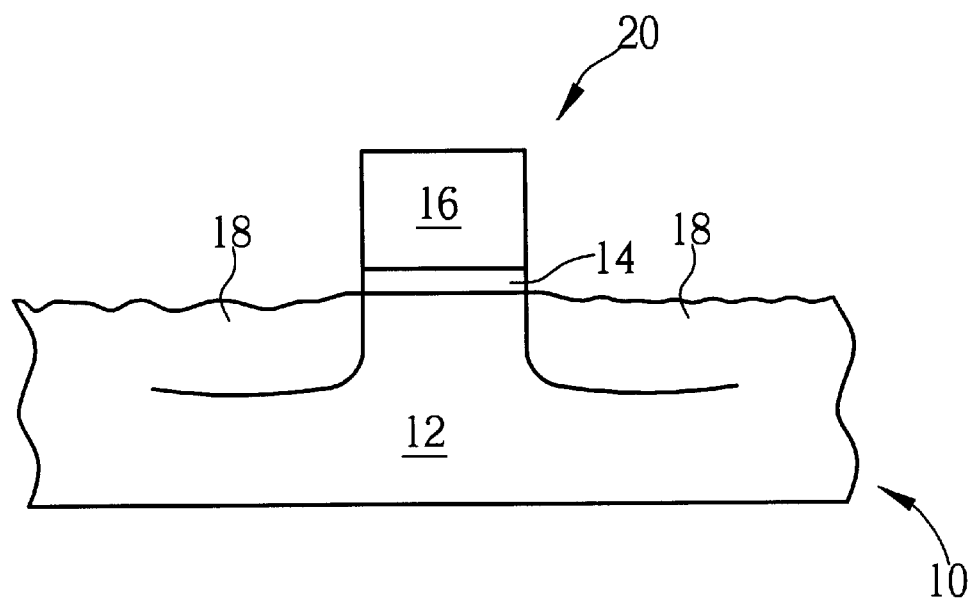
Figure 3:
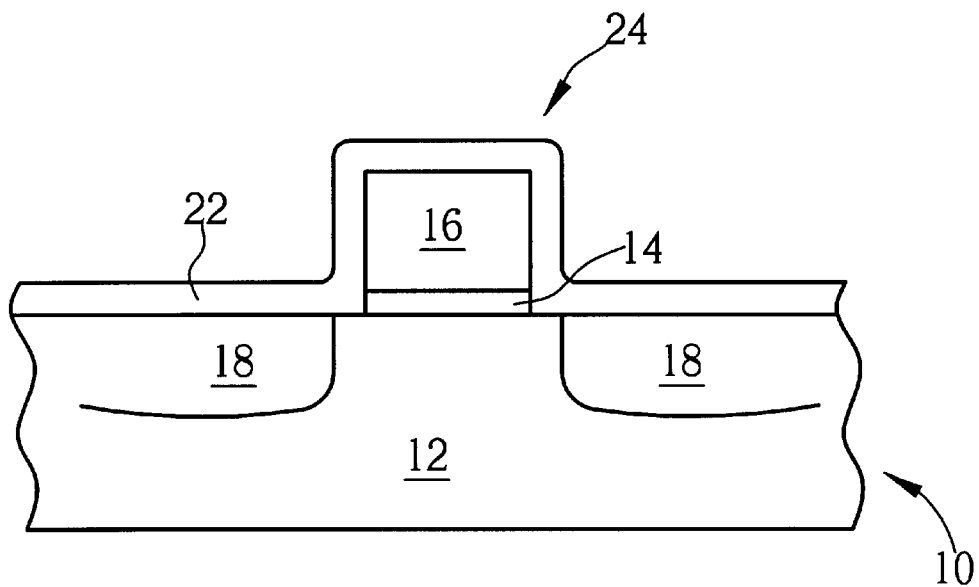
FIG. 3 and FIG. 4 are cross-sectional schematic diagrams of another method of forming a MOS transistor according to the prior art.
Figure 4:
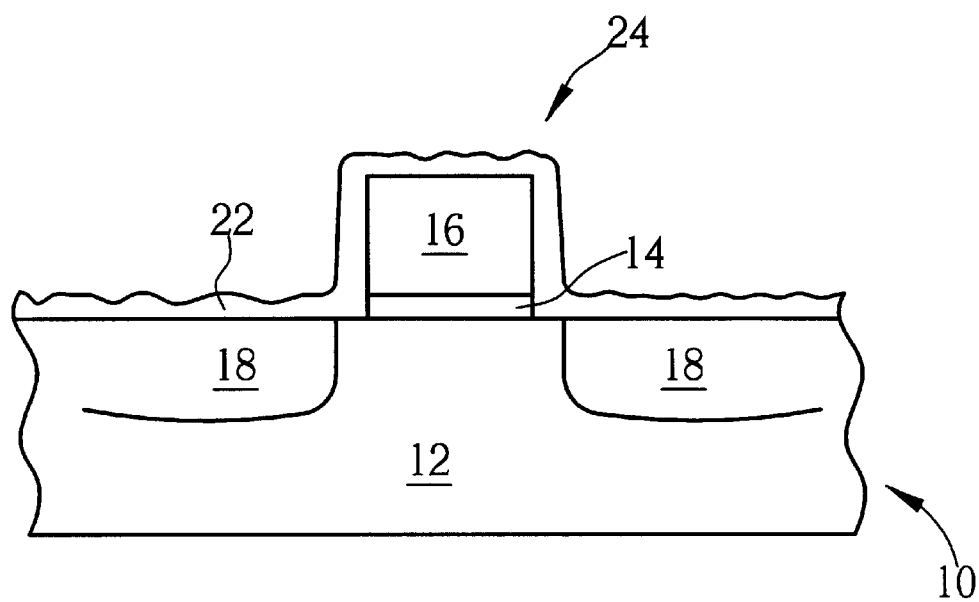
Figure 5:
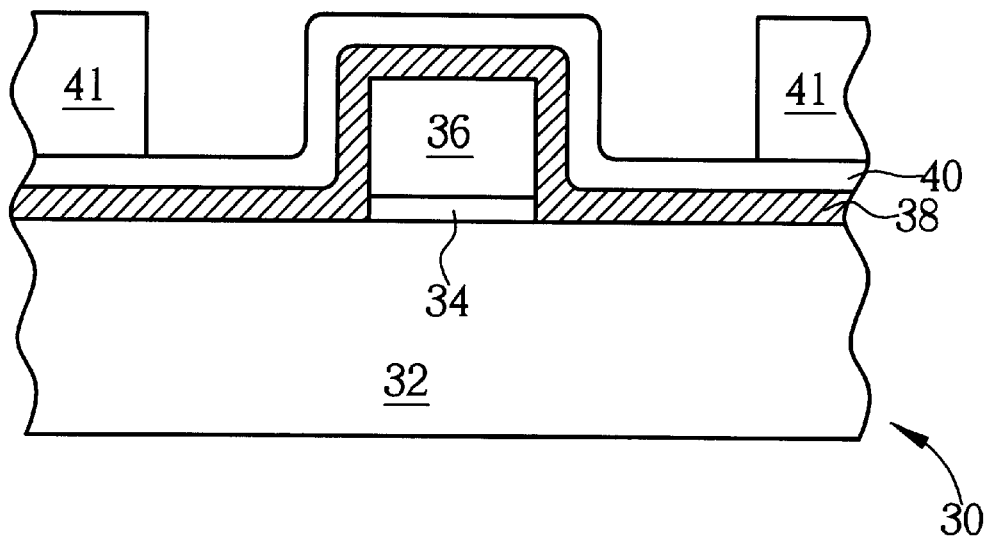
FIG. 5 to FIG. 10 are cross-sectional schematic diagrams of a method of forming a MOS transistor according to the present invention.

Please refer to FIG. 5 to FIG. 10. FIG. 5 to FIG. 10 are cross-sectional schematic diagrams of a method of forming a MOS transistor 50 according to the present invention. The present invention provides a method of forming the MOS transistor 50 for forming a PMOS transistor or an NMOS transistor on a semiconductor wafer 30. The semiconductor wafer 30 comprises a silicon substrate 32, a gate oxide layer 34 positioned on the silicon substrate 32, and a gate 36 positioned on a predetermined area of the silicon substrate 32. As shown in FIG. 5, a first deposition process is performed to form a uniformly thick protection layer 38 of silicon nitride on the semiconductor wafer 30, covering the surface of the gate 36. Then, a second deposition process is performed to form a silicon oxide layer 40 of uniform thickness on the protection layer 38. Next, a photoresist layer 41 is formed on a predetermined area of the silicon oxide layer 40 to define an active region.

Figure 6:
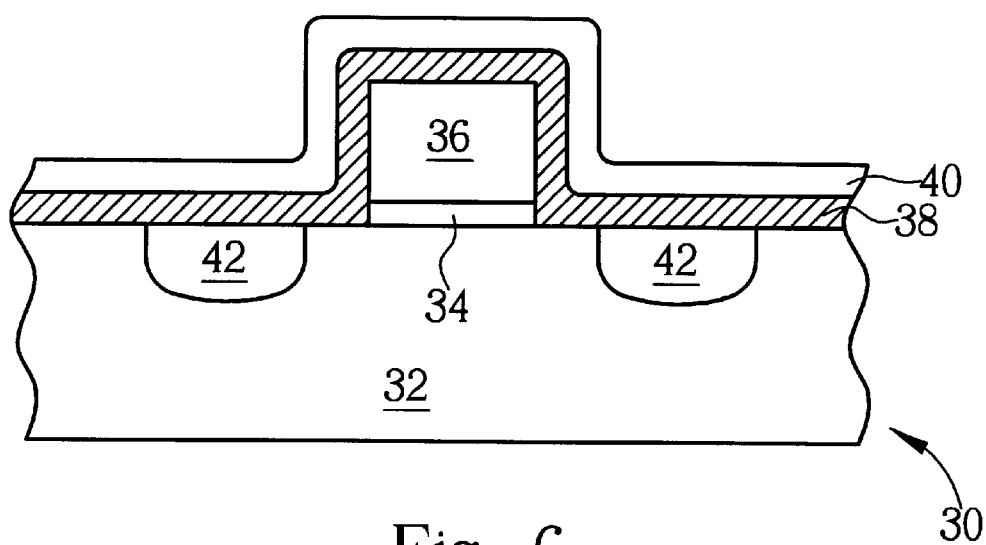

As shown in FIG. 6, a first ion implantation process is next performed, using the photoresist layer 41 and the gate 36 as a mask, to form a first ion implantation layer 42 with a first predetermined thickness around the gate 36 on the silicon substrate 32. Then, a stripping process is performed to remove the photoresist layer 41. Next, an RCA cleaning process that uses $H_2O_2$, $H_2O$, $NH_4OH$ or HCl as a cleaning solution is performed to rinse off contaminants on the semiconductor wafer 30.

Figure 7:
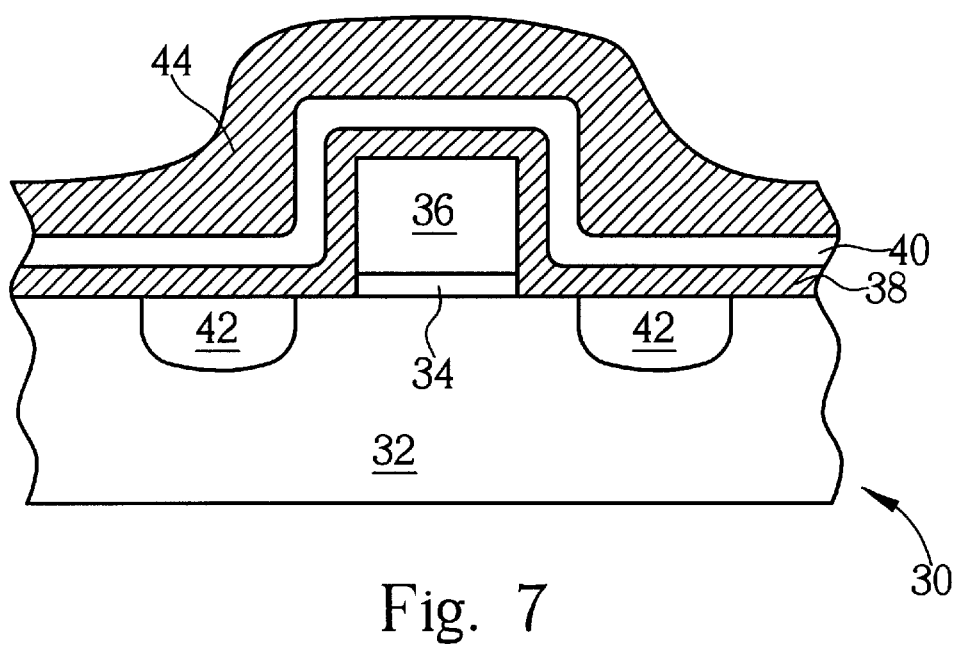
Figure 8:
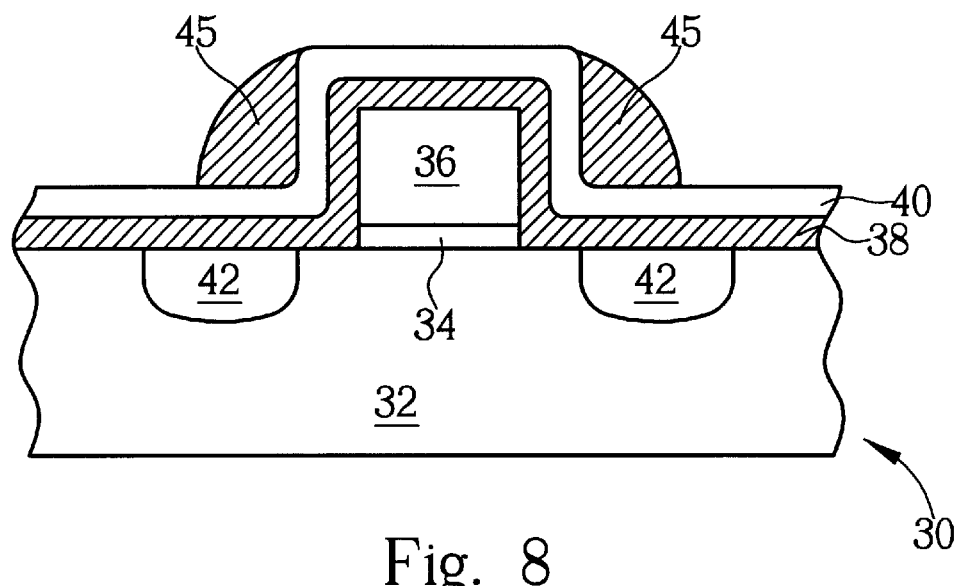
Figure 9:
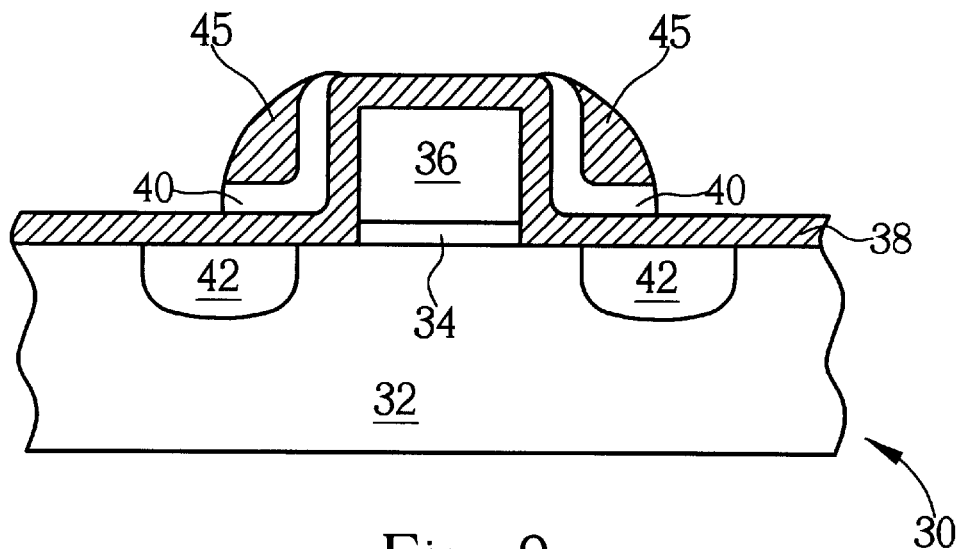

As shown in FIG. 7, a deposition process is then performed to form a silicon nitride layer 44 on the semiconductor wafer 30. As shown in FIG. 8, an etching back process that uses the silicon oxide layer 40 as an etching stop layer is then performed to remove a portion of the silicon nitride layer 44 from the silicon oxide layer 40. As shown in FIG. 9, an etching process that uses the protection layer 38 as an etching stop layer is then performed to remove a portion of silicon oxide layer 40 from the protection layer 38. The remaining portion of both the silicon oxide layer 40 and the silicon nitride layer 44 around the gate 36 is used as a spacer 45 of the gate 36.

Figure 10:
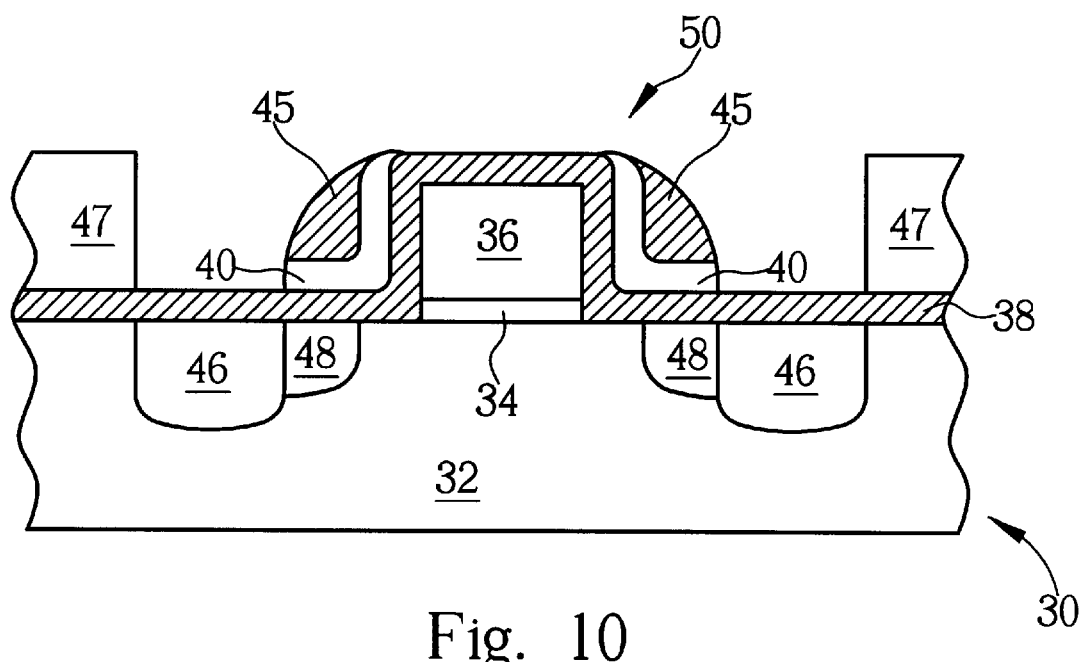

As shown in FIG. 10, another photoresist layer 47 is then formed on the semiconductor wafer 30 to define another active region. Next, a second ion implantation process is performed, using the photoresist layer 47 and the spacer 45 as a mask, to form a second ion implantation layer 46 with a second predetermined thickness on the silicon substrate 32 around the spacer 45 of the gate 36.

The second ion implantation process uses the same dopants as the first ion implantation process. The doping concentration, however, of the second ion implantation layer 46 is higher than that of the first ion implantation layer 42. Also, the second predetermined thickness of the second ion implantation layer 46 is thicker than the first predetermined thickness of the first ion implantation layer 42. The second ion implantation layer 46 is used as a source or drain (S/D) of the MOS transistor 50. The portion of the first ion implantation layer 42 that is not covered by the second ion implantation layer 46 is used as an LDD 48 of the MOS transistor 50.

Since the protection layer 38 is made of silicon nitride, the protection layer 38 protects the surface of the silicon substrate 32 from being etched during the RCA cleaning process, thus preventing an increase of the electrical resistance of the LDD 48. Also, the protection layer 38 is positioned between the silicon oxide layer 40 and the silicon substrate 32, and so protects the first ion implantation layer 42 from oxygen ions during the first ion implantation process, preventing oxide enhanced diffusion (OED). Furthermore, when the first ion implantation process uses boron ions as dopants, the protection layer 38 prevents the boron ions in the first ion implantation layer 42 from diffusing into the silicon oxide layer 40, preventing a decrease in the concentration of boron ions in the first ion implantation layer 42. Therefore, the method of the present invention prevents damage to the semiconductor wafer 30 caused by the RCA cleaning process and also ensures the electrical characteristics of the LDD 48, improving the performance of the MOS transistor 50.

Compared to the prior method of forming the MOS transistors 20,24, in the present invention method of forming the MOS transistor 50, a protection layer 38 made of silicon nitride is first formed on the semiconductor wafer 30 to prevent the surface of the silicon substrate 32 around the gate 36 from being etched during the RCA process. Also, this protects the first ion implantation layer 42 from oxygen ions during the first ion implantation process so as to prevent a decrease of the doping concentration of the first ion implantation layer 42.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method of forming a MOS transistor that is used as a PMOS transistor or an NMOS transistor on a semiconductor wafer, the semiconductor wafer comprising a silicon substrate and a gate positioned on the silicon substrate, the method comprising:

performing a first deposition process to form a protection layer of uniform thickness of silicon nitride on the semiconductor wafer to cover the surface of the gate;

performing a second deposition process to form a silicon oxide layer of uniform thickness on the protection layer;

performing a first ion implantation process to form a first ion implantation layer with a first predetermined thickness around the gate on the silicon substrate;

performing an RCA cleaning process to remove impurities on the semiconductor wafer;

forming a spacer positioned around the gate; and performing a second ion implantation process to form a second ion implantation layer with a second predetermined thickness around the gate on the silicon substrate, the second ion implantation layer being used as a source or drain (S/D) of the MOS transistor;

wherein the protection layer is used both to prevent dopants in the first ion implantation layer from diffusing into the silicon oxide layer so as to prevent a decrease in the concentration of the ions in the first ion implantation layer, and to prevent oxygen ions in the silicon oxide layer from diffusing into the first implantation layer or the second ion implantation layer during the first and the second ion implantation processes.

2. The method of claim 1 wherein the first ion implantation process uses boron ions as dopants.

3. The method of claim 1 wherein the second ion implantation process uses the same dopants as that used in the first ion implantation process, and the doping concentration of the second ion implantation layer is higher than that of the first ion implantation layer.

4. The method of claim 1 wherein the second predetermined thickness of the second ion implantation layer is thicker than the first predetermined thickness of the first ion implantation layer.

5. The method of claim 1 wherein the method of forming the spacer comprises:

performing a deposition process to form a silicon nitride layer on the semiconductor wafer; and performing an etching back process to remove a portion of both the silicon nitride layer and the silicon oxide layer from the protection layer;

wherein the remaining portion of both the silicon oxide layer and the silicon nitride layer are used as the spacer of the gate.

* * * * *